United States Patent [19]

Lemnios

[11] Patent Number: 4,954,852

[45] Date of Patent: Sep. 4, 1990

[54] SPUTTERED METALLIC SILICIDE GATE FOR GAAS INTEGRATED CIRCUITS

[75] Inventor: Zachary Lemnios, Colorado Springs, Colo.

[73] Assignee: Ford Microelectronics, Inc., Colorado Springs, Colo.

[21] Appl. No.: 138,504

[22] Filed: Dec. 24, 1987

[51] Int. Cl.⁵ .............................. H01L 29/78
[52] U.S. Cl. ............................ 357/15; 357/22; 437/176; 437/177; 437/178
[58] Field of Search .............. 357/15, 22 I; 437/177, 437/178, 176

[56] References Cited

PUBLICATIONS

IBM Technical Disclosure Bulletin, L. Berenbaum, "Metal Silicides for Schottky Barrier Diode Applications", vol. 22, No. 8A, 1/80, pp. 3206-3207.
Yokoyama, N. "A GaAs 1K Static RAM..." IEEE J. of Solid State Circuits, vol. SC-18, No. 5, Oct. 1983, pp. 520-524.
Ghandi, S. "VLSI Fabrication Principles" John Wiley & Sons, New York, 1983, pp. 12-14.

Primary Examiner—Andrew J. James
Assistant Examiner—David Soltz
Attorney, Agent, or Firm—Brooks & Kushman

[57] ABSTRACT

A method and resulting circuit structure (10) are disclosed for sputtering metallic silicide gates (18) on gallium arsenide integrated circuit structures. Silicon and metallic layers (14,15,14') are sputtered onto a gallium arsenide substrate (12) for stable high-temperature gate metallizations on VLSI structures.

11 Claims, 3 Drawing Sheets

SPUTTERED METALLIC SILICIDE GATE FOR GAAS INTEGRATED CIRCUITS

TECHNICAL FIELD

This invention relates to gate metallizations in integrated circuit structures, and in particular, to a sputtered metallic silicide gate structure.

BACKGROUND ART

Refractory silicides have long been recognized as low resistivity gates and interconnects for integrated circuit structures in silicon devices. Now, gallium arsenide integrated circuits are being made with refractory silicide metallizations for self-aligned gates. Gallium arsenide integrated circuits are currently being utilized for VLSI structures, and conventional semiconductor fabrication techniques introduce certain problems when applied to gallium arsenide VLSI structures.

Conventional semiconductor processing utilizes an annealing step of 300 to 500 degrees Centigrade to activate the implanted source and drain regions. The manufacture of gallium arsenide circuits includes an annealing step of much higher temperatures, thereby requiring a greater thermal stability of the metal-gallium arsenide Schottky contact in order to withstand elevation to the higher temperatures, typically about 750 to 900 degrees Centigrade.

Previous work has concentrated on silicide composition in order to achieve the necessary thermal stability at the higher temperatures. Some recent articles indicative of this interest were published by (1) Toyokazu Ohnishi and Naoki Yokoyama, of Fijitsu Laboratories Ltd., Atsugi, Workshop on Refractory Metals and Silicides for VLSI III, May 13–16, 1985, and (2) T. N. Jackson and J. F. DeGelormo, J. Vac. Sci. Technol., Vol. B3. November 1985, pp. 1676–1679.

Recently, experiments in gallium arsenide device fabrication have included polycrystalline silicon as the interconnection material in integrated circuits. Metallic silicides have been used in the place of the polycrystalline silicon as an interconnection material to overcome the disadvantages presented. The primary disadvantage is the relatively high minimum sheet resistivity of polysilicon of about 10 ohms per square. Titanium silicide, having a sheet resistance less than about one ohm per square, has been used to improve performance of large-scale integrated circuits employing MOSFET'S.

U.S. Pat. No. 4,545,116 issued Oct. 8, 1985 to Chi Lau discloses a method of forming titanium disilicide on silicon or polysilicon substrate in which a masking layer such as silicon dioxide is formed on a silicon slice and patterned to expose selected areas of the sliced surface. The slice is thereafter sputter-etched, followed by in situ deposition of single layer of titanium material. The silicon slice was then heated to convert the portion of the titanium layer in contact with the silicon to a titanium disilicide, and then the non-converted titanium was removed by a selective etchant.

Another problem presented in the fabrication of gates in gallium arsenide integrated circuits is the lack of adhesion of the gate to the substrate. In previous attempts to form gates on gallium arsenide, the Schottky diode quality has been relatively low due the adhesion problems. Scientists and engineers have been trying to solve this problem.

In order to ascertain the quality of devices produced, scientists look to two parameters, the ideality factor, and the I-V characteristics. The closer an ideality factor is to 1.0, the better the device. In terms of I-V characteristics, the barrier height measurement, which may also be referred to as the built-in potential, should be as close as possible to the theoretical Thermionic-Emission model. A value for this parameter of 0.80 eV is considered to be very good. Some of the best recently reported data for a tungsten silicide Schottky barrier on a gallium arsenide substrate had a measured ideality factor of 1.15 with a built-in potential of 0.80 eV after a 750 degree Centigrade annealing, as described by Shinoki, Shibatomi and Ishikawa in the IEEE Journal of Solid-State Circuits, Vol. SC-18, No. 5, October 1983, pp. 520–524.

Yet another problem presented when fabricating integrated circuits is the scaling down of interconnection and gate line widths both of which are required to achieve very large scale integration. Metallic silicides have proven to be advantageous in overcoming these problems because conventional silicidation is accompanied by out-diffusion which occurs during the reaction process. Silicon diffuses through the silicide layer into the metallic layer and reacts with the metal to form metallic silicide outside the original pattern. During further processing steps, the line width of the original pattern is thus destroyed. In extreme cases, bridging silicides between adjacent lines forms shorts by the out-diffused silicon. In the case of titanium silicide, this has caused a major problem in the preparation of VLSI circuit structures.

In summary, the above-mentioned problems of poor Schottky diode quality, adhesion, sheet resistivity, etc., become especially important in the fabrication of integrated circuits using gallium arsenide substrates. Devices of this type require superior characteristics of gate metallization. If such structures are to be used to provide a stable, high-temperature gate metallization in VLSI structures which exhibit optimum Schottky barrier heights and ideality factors, these problems must be overcome.

DISCLOSURE OF THE INVENTION

Applicant has discovered a method of making a new device structure which allows all of the advantages of gallium arsenide materials to be realized in a semiconductor device of, for example, a VLSI structure without forming a gate metallization having deleterious properties. Further, the method and devices of the present invention may also be utilized to advantage in other integrated circuit structures which require similar I-V characteristics. The invention attempts to provide a device-quality semiconductor structure incorporating a metallic silicide Schottky barrier on gallium arsenide which will maximize the VLSI structure and its characteristics thereof while resulting in an integrated circuit structure of enhanced current capability and efficiency.

The VLSI integrated circuit structures of prior art devices are enhanced in accordance with the present invention by sputter depositing a composite metallic silicide gate onto a pre-cleaned gallium arsenide substrate. In a first embodiment of the present invention, a multi-layer metallic silicide gate is formed which includes a first layer of silicon adjacent the substrate, formed from the sputter deposition of a silicon target, and a second metallic layer deposited thereon in a similar fashion. Thereafter, multiple layers of sequentially and alternatively co-sputter deposited silicon and metal of relatively thin dimensions are deposited one on top of the other. These layers of silicon and metal have an individual thickness of from about 50 to 100 angstroms each, and preferably have a thickness of about 75 angstroms.

In further embodiments of the present invention, metallic silicide gates are formed by sputtering from a composite target such as one formed of a metallic silicide or one formed of either a silicon or metal target having the desired amount of area covered with the other material, as well as co-sputtering from individual silicon and metallic targets. Hence, various advantages are realized by the individual preferred embodiments.

In overcoming the above described problems, the present invention discloses a gallium arsenide integrated circuit structure which includes a gallium arsenide substrate having a metallic silicide gate formed thereon of sequentially sputtered multiple layers of silicon and metal. The multiple layers preferably include a first layer of silicon and many alternating subsequent layers of tungsten and silicon. The multiple layers are co-sputtered, and are formed by placing the substrate under alternating silicon and tungsten targets to deposit individual sequential alternate layers. At least three layers are included, while it has been shown by experimentation that about 39 alternating layers produce very good results. These layers have individual of about 50 to 100 angstroms each, and preferably are deposited to about 75 angstroms.

The present invention finds particular applicability in making a gallium arsenide integrated circuit structure using a (100)-oriented gallium arsenide substrate. Preferably, relatively thin layers of silicon and tungsten are deposited to a collective thickness of about 3,000 angstroms to form a multi-layer gate for an integrated circuit. The gate of the resultant device is expected to exhibit good adhesion properties, high temperature thermal stability and good I-V characteristics.

A method for fabricating such a tungsten silicide gate on a gallium arsenide substrate is further disclosed which includes sputter-etching the substrate to remove surface contaminants, sputter depositing many thin layers of silicon and tungsten to a collective thickness of about 3000 angstroms and then patterning the resulting gate by reactive ion etching to the desired configuration. The method may also include depositing an encapsulating layer by PECVD on all surfaces of the substrate and thereafter annealing for about 20 minutes in an argon environment.

The method and devices of the present invention may also be utilized in the making of various other interconnections within an integrated circuit. Again, because the tungsten silicide gate structure described displays good adhesion and Schottky diode qualities, the I-V characteristics of each circuit can be maximized for a given application. Hence, metallic silicide layers for providing enhanced I-V characteristics can also be fabricated employing the preferred embodiment without experiencing the problems of the prior art.

The advantages of the present invention will be readily understood as the same becomes better understood by reference to the following detailed description when taken in connection with the accompanying drawings.

BRIEF DESCRIPTION OF THE DRAWING

Other objects and advantages of the invention will become apparent upon reading the following detailed description and upon reference to the drawings, in which.

While the invention will be described in connection with a preferred embodiment and procedure, it will be understood that it is not intended to limit the invention to that embodiment or procedure. On the contrary, it is intended to cover all alternatives, modifications and equivalents as may be included within the spirit and scope of the invention as defined by the appended claims.

DETAILED DESCRIPTION OF THE INVENTION

Figure 1:
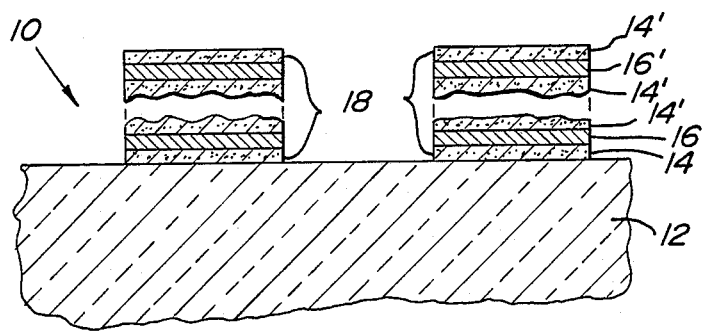
FIG. 1 is a fragmentary view of one embodiment of an integrated circuit structure to illustrate a multi-layer structure made in accordance with this invention and being directed to a Schottky barrier device.

Turning first to FIG. 1, there is shown an integrated circuit structure 10 including a gallium arsenide substrate 12 having multiple layers 14, 16, 16', and 14' of silicon and metal deposited thereon. Substrate 12 supports multiple layers 14 and 16, and provide a base for metallic silicide gate 18. In the particular device illustrated, metallic silicide gate 18 has been formed as a Schottky contact between the metal silicide and the gallium arsenide. Metallic silicide films have been used successfully as the gate material in gallium arsenide integrated circuits. Metals which are of interest include titanium, molybdenum, and particularly tungsten. Typically, refractory metals perform with the most advantageous results.

Referring again to FIG. 1, first layer 14 is preferably comprised of silicon, followed by a second layer of metal 16, which is preferably tungsten, although either layer may be spotted on first. This multi layer gate structure 18 is therefore formed of multiple layers of alternating, sequentially sputtered, relatively thin multiple layers of silicon and a metal deposited onto the gallium arsenide substrate 12. The multiple layers 18 include a first layer 14 and have at least two subsequent layers 16 and 14' sputtered thereon. Substrate 12 may be a gallium arsenide substrate which is (100)-oriented. The multiple layers 14 and 16 are co-sputtered layers formed by placing substrate 12 under alternately silicon and metal targets in a sputtering unit whereby individual sequential alternate layers are deposited. Multiple layers 14, 16, 16' and 14' include at least three alternating silicon and metallic layers, and are preferably alternating silicon and tungsten layers. Experimentation has shown that about thirty-nine sequentially alternating layers of tungsten and silicon form a Schottky contact which is most advantageous.

Still referring to FIG. 1, multiple layers 14, 16, 16'0 and 14' have individual thicknesses of from about 50 to 100 angstroms each, and preferably approximately 75 angstroms. The advantages of such thin layers being deposited include good adhesion, superior diode quality and electrical performance. In previous works, the chemical composition of the metallic silicide film was emphasized as the single most important factor for gallium arsenide Schottky gates. The present invention shows that beside silicide composition, surface cleaning procedures and silicide deposition techniques have a greater effect on the diode I-V characteristics, the thermal stability of the Schottky contact and the silicide adhesion to the gallium arsenide substrate.

In U.S. Pat. No. 4,398,335, multi layer metal silicide interconnections for integrated circuits were formed by chemical vapor deposition into selected regions and annealed to form a metal silicide in the openings. The layers were disclosed to be approximately 1000 to 4000 angstroms in thickness. In the present invention, multiple layers 14, 16' 16, and 14' have a collective thickness of from about 500 to 5000 angstroms, and preferably about 3000 angstroms.

Figure 2:
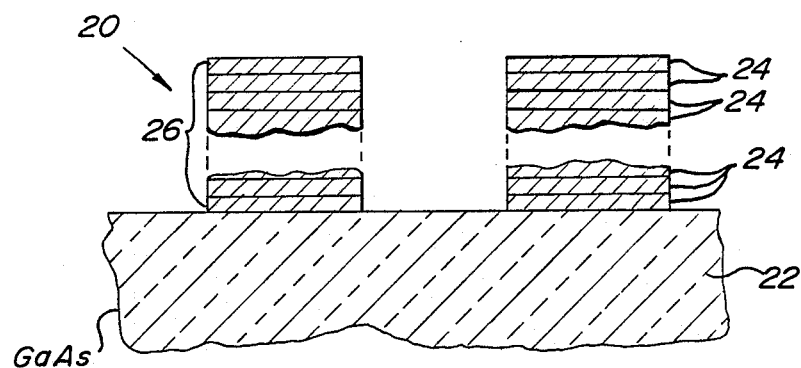
FIG. 2 is a fragmentary view of another embodiment of an integrated circuit to illustrate a second application of the metallic silicide gate made in accordance with this invention.

Referring now to FIG. 2, another embodiment of the present invention is illustrated. As shown, the integrated circuit structure 20 includes a gallium arsenide substrate 22 having an upper surface upon which multiple layers 24 of a metallic silicide have been deposited. Multiple layers 24 form a metallic silicide gate 26 of a composite material. There are at least three multiple layers 24 which comprise gate 26, and preferably many relatively thin layers are deposited similar to the device as described in reference to FIG. 1. This is accomplished in the present instance by composite sputtering material of the form $MSi_x$ wherein $0.3 \geq X \geq 0.8$ and the metallic silicide forms a Schottky contact to the gallium arsenide substrate. Thin multiple layers 24 are each sputtered to a thickness of from 50 to 100 angstroms thick, preferably 75 angstroms, to achieve a collective thickness from about 500 to 5000 angstroms. Composite sputtering is well known in the art and may be accomplished by sputtering from a composite or alloyed target in the first instance, or, a silicon target having selected areas covered by a metal in the second instance.

With reference to the integrated circuit structures as shown in FIGS. 1 and 2, the present invention discloses a multi layer metallic silicide Schottky contact formed on a gallium arsenide substrate. In the preferred embodiments, the metal will be a refractory metal, for example, tungsten, molybdenum, titanium, or niobium. Any other refractory metal which will form a silicide with silicon to form a conductive layer may also be used. The selection of the metal will be determined by the particular device which is ultimately desired. The multiple layers are sputtered to prevent peeling from the substrate, to exhibit certain bonding characteristics to perform with a high thermal stability, and to achieve sufficient electrical connection in a manner which will aid in the I-V characteristics.

Figure 3:
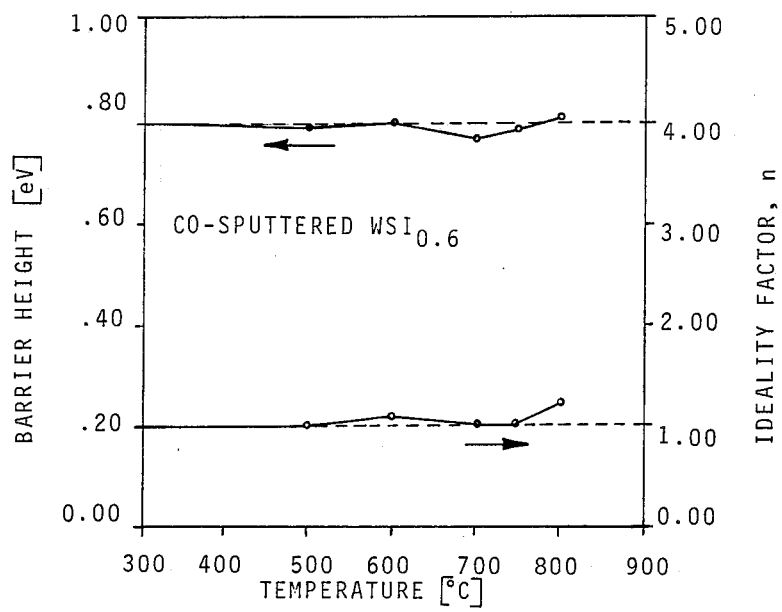
FIG. 3 is a graph setting forth curves plotting barrier height (eV) against annealing temperature for co-sputtered tungsten silicide.

Referring now to FIG. 3, a graph is shown which illustrates the barrier height and ideality factor of a co-sputtered tungsten silicide device against the temperature to which the device had been subjected. A (100)-oriented gallium arsenide substrate was silicon doped to $(5.9-6.2) \times 10^{16} cm^{-3}$. Before the silicide deposition, the samples were sputter etched in a one-torr oxygen plasma with a power of 100 watts for two minutes to remove surface organic contaminants. A dilute ammonium hydroxide rinse was then used to remove carbon and oxide layers and the gallium arsenide surface. The wafers were then blown dry in pure nitrogen. A two-target sputtering system with a DC magnetron sputtering target (tungsten) and a RF sputtering target (silicon) was used to co-sputter a tungsten silicide film from the two targets at an argon gas pressure of ten millitorr. Substrate rotation was used to ensure uniform coverage. The tungsten target was sputtered with a power density of 3 watts per $cm^2$ and the silicon target was sputtered with a lower density of 2.1 watts per $cm^2$. The first layer was a silicon layer of approximately 75 angstroms, and was followed thereafter by 38 layers of alternating and sequential layers of tungsten and silicon of similar thickness, to a collective thickness of 3000 angstroms.

The silicide Schottky contacts were thereafter patterned by reactive ion etching with a carbon tetrafluoride/oxygen plasma. The reactive ion etching rate was approximately 200 angstroms per minute for an oxygen content of 10 percent and a RF power of 150 watts. Plasma enhanced chemical vapor deposited silicon dioxide was then deposited on both the front and back sides of the samples as encapsulating layers. Thereafter, the contacts were annealed for 20 minutes in forming gas. After annealing, the silicon dioxide on the back side of the sample was removed by reactive ion etching. Ohmic contacts were then formed by evaporation of Au-Ge, followed by a sintering step at 450® centigrade for one minute. The ultimate ratio between tungsten and silicide was $WSi_{0.6}$. In the graph below, the data results show that the ideality factor had a value of 0.99, while the Schottky barrier height had a value of 0.79.

| Type | B |
|---|---|
| Target | Co-sputter |
| n | 0.99 |
| $\Phi_B$ | 0.79 |
| Composition of film | $WSi_{0.6}$ |
| Ar gas pressure | 10 m Torr |
| Power density | W: DC magnetron $3W/cm^2$ Si: RF power $2.1 W/cm^2$ |
| Substrate bias | No |
| Substrate Rotation | Yes |
| Annealing | n, $\Phi_B$ remains constant up to 750° C. |

Figure 4:
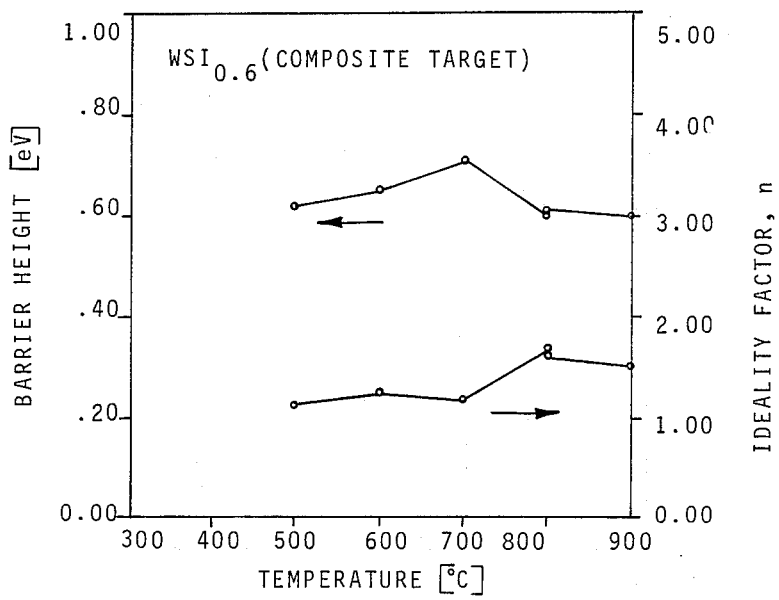
FIG. 4 is a graph setting forth curves plotting barrier height (eV) against annealing temperature for tungsten silicide sputtered from a composite target.

Referring now to FIG. 4, a graph is shown which illustrates the results of an experiment practicing another embodiment of the present invention. A single composite target with the desired W-Si composition, i.e. a high purity tungsten target covered with silicon strips, was utilized to sputter deposit $W-Si_{0.6}$ metallic silicide films. Again, barrier height and ideality factor were charged against the temperature to which the device had been annealed.

As in the above example, multiple layers of the tungsten silicide were deposited onto a gallium arsenide substrate. Precleaning conditions were the same, and the only significant difference in the preparation of the sample is the composition of the sputtering target. The chart below details the result of various compositions of tungsten and silicon, i.e. $WSi_{0.42}$, $WSi_{0.6}$, and $WSi_{2.3}$, and their respective ideality factors and barrier heights.

| DEPOSITION CONDITIONS AND DIODE PARAMETERS OF TYPE A and TYPE B CONTACTS | | | |
|---|---|---|---|
| Type | | A | |
| Target | Composite | Composite | Composite |
| n | 1.03 | 1.07 | 1.04 |
| $\Phi_B$ | 0.64 | 0.61 | 0.64 |
| Composition of film | $WSi_{0.42}$ | $WSi_{0.6}$ | $WSi_{2.3}$ |
| Ar gas pressure | 20 m Torr | 20 m Torr | 20 m Torr |
| Power density | RF power 0.8 W/cm$^2$ | RF power 0.8 W/cm$^2$ | RF power 0.8 W/cm$^2$ |
| Substrate bias | −80 V | No | No |
| Substrate Rotation | No | No | No |
| Annealing | n and $\Phi_B$ degrade at lower temperatures with large deviations | | |

Figure 5:
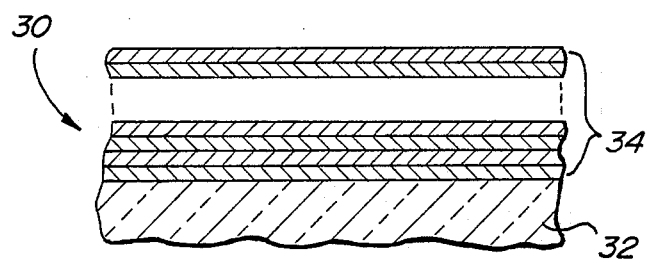
FIGS. 5a through 5c illustrate construction of an integrated circuit as it progresses through the steps of the method.
Figure 6:
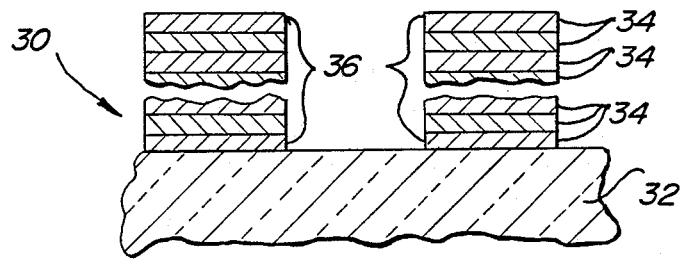
Figure 7:
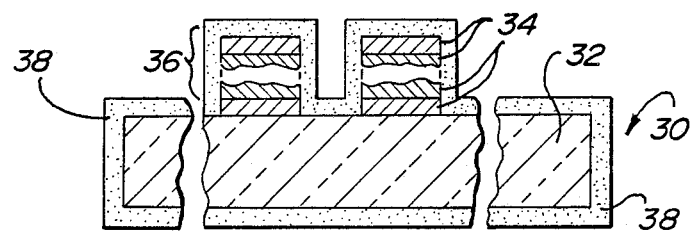

With reference to FIGS. 5 through 7, cross sectional views of a portion of a gallium arsenide integrated circuit are shown at various stages of fabrication according to the present invention. As shown in FIG. 5, the preliminary step is shown to produce an integrated circuit 30, in which a gallium arsenide substrate 32 has deposited thereon multiple sputtered layers of metallic silicide material 34. Prior to the deposition, the surface of substrate 32 was precleaned to remove surface contaminants, and such is accomplished by sputter etching. Preferably, a first layer is a sputter deposited silicon to a thickness from about 50 to 100 angstroms, and preferably 75 angstroms. Likewise, a second layer is sputter deposited to a thickness of about 50 to 100 angstroms, and preferably 75 angstroms. Thereafter, sequential multiple layers of silicon and metal are deposited, one on top of the other. It has been found that by applying a negative bias to the substrate during the sputter deposition, a superior device has been achieved.

In the instance of co-sputtering, the sputter depositing of silicon is accomplished by RF sputtering from a silicon target, while the sputter depositing of tungsten is accomplished by DC magnetron sputtering from a tungsten target. Also, the substrate 32 is rotated between silicon and tungsten targets while remaining under vacuum in a conventional sputtering system. A composite target may also be used to form a metallic silicide of a desired composition on top of substrate 32. Preferably, multiple layers of tungsten silicide are deposited to a final ratio of 5 to 3 tungsten to silicon.

Referring now to FIG. 6, the resultant gates 36 are patterned by reactive ion etching, such as with carbon tetrafluoride in a sulphur hexafluoride and oxygen gas mixture. In the instance of the use of carbon tetrafluoride oxygen, the etching is accomplished at a rate of about 200 angstroms per minute at an RF power of about 150 watts.

In looking to FIG. 7, an encapsulating layer 38 of silicon dioxide is deposited on all sides of the substrate by plasma enhanced chemical vapor deposition and annealed for about 20 minutes in an argon environment. Thereafter, conventional fabrication techniques may be utilized to form a completed integrated circuit.

In accordance with the invention, it is apparent that there has been provided a gallium arsenide integrated circuit that fully satisfies the objects, aims, and advantages as set forth above. While the invention has been described in conjunction with specific embodiments thereof, it is evident that several alternatives, modifications, and variations will be apparent to those skilled in the art in light of the foregoing description. Accordingly, the present invention is intended to embrace all such alternatives, modifications, and variations as they shall fall within the spirit and broad scope of the appended claims.

What is claimed is:

1. A GaAs integrated circuit structure, comprising a GaAs substrate and a metallic silicide gate formed of at least three sequentially sputtered, multiple layers of silicon and a metal deposited onto the GaAs substrate, said multiple layers including a first layer and having at least two subsequent layers sputtered thereon, wherein said multiple layers have an individual thickness of from about 50 to 100 angstroms each.

2. A circuit structure as in claim 1 wherein said GaAs substrate includes a (100)-oriented gallium arsenide substrate.

3. A circuit structure as in claim 1 wherein said multiple layers include co-sputtered layers formed by placing the substrate under alternating silicon and metal targets whereby individual sequential alternate layers are deposited.

4. A circuit structure as in claim 1 wherein said multiple layers include at least three alternating silicon and tungsten layers.

5. A circuit structure as in claim 1 wherein said multiple layers include at least 39 layers.

6. A circuit structure as in claim 1 wherein said multiple layers have an individual thickness of from about 50 to 100 angstroms each.

7. A circuit structure as in claim 1 wherein said multiple layers have an individual thickness of about 75 angstroms. wherein said multiple layers have an individual thickness of from about 50 to 100 angstroms each.

8. A circuit structure as in claim 1 wherein said multiple layers have a collective thickness of from about 500 to 5,000 angstroms, whereby the metallic silicide gate has a thickness of from about 500 to 5,000 angstroms.

9. A circuit structure as in claim 1 wherein the collective thickness of the multiple layers is about 3,000 angstroms.

10. A GaAs integrated circuit structure, comprising:
   a (100)-oriented gallium arsenide substrate (12);
   a tungsten silicide gate (18) formed of sequentially and alternatively co-sputter deposited multiple layers (14,16,14',16,) of silicon and tungsten on the gallium arsenide substrate;
   the first of said multiple layers being a layer of silicon (14) sputtered from a silicon target to a thickness of about 75 angstroms;
   the second of said multiple layers being a layer of tungsten (16) sputtered from a tungsten target to a thickness of about 75 angstroms;
   the third of said multiple layers being a second layer of silicon (14') sputtered from a silicon target to a thickness of about 75 angstroms;
   subsequent layer of gate material being alternating layers of tungsten (16') and silicon (14'), one on top of the other formed to a total gate thickness of about 3,000 angstroms.

11. A GaAs integrated circuit structure, comprising:
   a GaAs substrate;
   a thin barrier layer of a composite sputtered metallic silicide deposited atop said substrate to form a Schottky barrier, said composite sputtered metallic silicide having a silicon: metal ratio of between 0.3 and 0.8:1; and
a plurality of subsequent thin layers of metallic silicide material deposited atop said barrier layer, said barrier layer and each of said plurality of subsequent thin layers sputtered to a thickness from 50 to 100 angstroms thick to achieve a collective thickness of from 500 to 5000 angstroms.

* * * * *